United States Patent
Kravtchenko et al.

(10) Patent No.: US 6,718,505 B1
(45) Date of Patent: Apr. 6, 2004

(54) METHOD AND APPARATUS FOR ERROR CORRECTION IN A PROCESS OF DECODING CROSS-INTERLEAVED REED-SOLOMON CODE (CIRC)

(75) Inventors: Alexander Kravtchenko, Villingen-Schwenningen (DE); Friedrich Rominger, Brigachtal (DE); Jürgen Vogel, Brigachtal (DE)

(73) Assignee: Thomson Licensing S.A., Boulogne Cedex (FR)

( * ) Notice: Subject to any disclaimer, the term of this patent is extended or adjusted under 35 U.S.C. 154(b) by 491 days.

(21) Appl. No.: 09/723,423

(22) Filed: Nov. 28, 2000

(30) Foreign Application Priority Data

Dec. 21, 1999 (EP) ............................................ 99250443

(51) Int. Cl.⁷ .......................................... H03M 13/00
(52) U.S. Cl. ...................................... 714/756; 714/767
(58) Field of Search ................................ 714/755, 756, 714/765–767; 369/44.26, 47.19, 47.26, 47.4, 47.46, 53.22, 59.25, 59.26, 275.3; 360/48, 53

(56) References Cited

U.S. PATENT DOCUMENTS

| | | | |
|---|---|---|---|
| 4,476,562 A | | 10/1984 | Sako et al. ................. 714/756 |
| 4,497,058 A | | 1/1985 | Sako et al. ................. 714/756 |
| 4,546,474 A | * | 10/1985 | Sako et al. ................. 714/756 |
| 4,637,021 A | * | 1/1987 | Shenton ....................... 714/756 |
| 4,852,099 A | * | 7/1989 | Ozaki .......................... 714/756 |
| 5,412,667 A | * | 5/1995 | Havemose .................. 714/756 |
| 5,506,823 A | | 4/1996 | Sanada ....................... 369/47.2 |
| 5,870,366 A | | 2/1999 | Sako ......................... 369/59.25 |

FOREIGN PATENT DOCUMENTS

EP 0652561 5/1995 ........... G11B/20/12

\* cited by examiner

*Primary Examiner*—Emmanuel L. Moise
(74) *Attorney, Agent, or Firm*—Joseph S. Tripoli; Joseph J. Laks; Ronald H. Kurdyla

(57) ABSTRACT

The invention relates to an error-correction method for use in a process of decoding cross-interleaved Reed-Solomon code (CIRC) that corrects errors in data stored as C1 code words and C2 code words in a memory with several locations, each of said locations containing a data byte of said data, and an apparatus performing said method. The new method implies specific regulations for defining which data words are to be used for C1 and C2 decoding and for the processing order. The system memory for a deinterleaver implementation can be of a smaller size as compared to conventional memories. In addition, only a single CIRC decoder needs to be used for performing the process of decoding cross-interleaved Reed-Solomon code.

15 Claims, 7 Drawing Sheets

METHOD AND APPARATUS FOR ERROR CORRECTION IN A PROCESS OF DECODING CROSS-INTERLEAVED REED-SOLOMON CODE (CIRC)

The invention relates to a method and an apparatus for correcting errors in a stream of data by using a method of decoding a cross-interleaved Reed-Solomon code (CIRC).

BACKGROUND OF THE INVENTION

There has been a demand for increased quality of audio recording and read back systems as well as of other types of communication.

One problem with recording media are the defects in the media resulting in areas with improperly recorded digital data or in data that cannot be read back reliably. As a result errors occur in the read back data as well as in transmissions of digital data. During recording, read back and transmission of digital data, errors occur in the digital data with some finite probability. The data is typically composed of binary units, a group of binary units (such as 8) makes up a data byte, and groups of bytes (such as 2) make up a data word. Additionally the data is arranged into blocks of data (such as 32 or 28 byte blocks).

There are two different types of errors. The first type is a single bit error which is the substitution of one of two possible values of a binary bit for its opposite value. Such errors usually occur randomly in a digital signal. A second type of error consists of a continuous sequence of erroneous bits. Such errors are referred to as burst errors. The length of these bursts and their frequency of occurrence are also random.

One error correction code that is typically used in compact audio discs is a so-called CIRC correction code. CIRC is an acronym for crossinterleaved Reed-Solomon code. The CIRC utilises a two-step process. In passing through a first encoder, 24 consecutive data bytes representing a data polynomial are divided by a generator polynomial. In this process, four parity bytes are added. The result is a block of 24 data bytes and 4 parity bytes (C1 code). This consecutive sequence of bytes is interleaved or dispersed among other encoded data bytes.

The interleaved data is passed through a second encoder. The second encoder is identical to the first except that the bytes are presented in a different sequence due to interleaving, parity bytes together with data bytes are being encoded, blocks of 28 bytes (28 data bytes plus 4 parity bytes) are being encoded instead of 24 byte blocks, and 4 additional parity bytes are added. The result of the second encoding process is a 32 byte block (C2 code) composed of 24 data bytes and 8 parity bytes.

In the case of the CIRC correction code, the encoding process of the (28, 24) Reed-Solomon code is performed for twenty-four data symbols (bytes), with each symbol consisting of 8 bits. In typical audio applications each audio sample comprises 16 bits and is formed of two symbols of 8 bits each. Thus, each 8-bit symbol is either the upper or lower side of an audio sample of one of the two channels of stereophonic audio data.

The encoded data is recorded optically and subsequently read back. After the encoded data is read back, there will likely be single bit or burst errors due to recording, read back or transmission problems.

Conventional error correction methods are known for use in decoding CIRC. Examples of such methods are disclosed in U.S. Pat. No. 4,546,474, U.S. Pat No. 4,476,562 and U.S. Pat No. 4,497,058. According to the conventional methods for decoding CIRC errors, the processing is run on the basis of a so-called erasure correction method. In the erasure correction method the location of error symbols is indicated by means of pointer information. Error correction is performed on this error symbol. In the case of above-mentioned C1 and C2 codes, detection and correction up to double errors can be performed. However, if the error location is already know, then error correction up to 4 erasures can be performed. Therefore, in order to raise the error-correction capability, the implementation of the erasure correction method for error correction has been preferred. In addition, the erasure correction method has been found to be particularly effective in correcting burst errors.

According to the conventional method used for decoding CIRC errors, correction of up to two errors is performed in the C1 decoder. If triple errors or more occur, which of course are not corrected, C1 pointer information is sent to the C2 decoder in the next stage, so that error correction is performed in the C2 decoder utilising C1 pointer information.

Multiple use of the CIRC correction codes in decoding leads to an increase in correction capability of error correction systems. However, conventional decoding methods (CIRC decoders) are incapable of multiple processing of blocks of CIRC codes. In order to solve this problem, one can either provide conventional CIRC decoders with additional means or devices which allow multiple processing or make conventional CIRC decoders useful for multiple processing.

One method (conventional CIRC decoder) for multiple processing of CIRC codes has been disclosed in U.S. Pat No. 4,852,099. The known method uses the erasure correction method to increase the correction capability of error correction systems. It is proposed to perform C1 decoding and C2 decoding twice in a specific order. That order, for example, might be, C1 decoding, followed by C2 decoding, followed by C1 decoding, and followed by C2 decoding.

According to this example, C1 code words are supplied to a C1 decoder in which actual decoding of the (32, 28) Reed-Solomon code is performed. Error correction of up to two errors is performed. If three or more errors are detected by the C1 decoder, a C1 pointer is set for all symbols in C1 code words. Then data and error pointers corrected by means of C1 decoder are further processed in a deinterleave processing stage. An output of the deinterleaver is supplied to the C2 decoder. Erasure correction of up to four erasures is executed in the C2 decoder utilising C1 pointer information. Upon completion of erasure correction in the C2 decoder the C1 pointer is cleared and no pointer information is transferred to the second C2 decoding cycle.

In a second cycle data from the C2 decoder is supplied to the interleaver that returns the data to the same arrangement as it was when it was reproduced. Thereafter, the processing in the second decoding cycle corresponds to the processing in the first decoding cycle. By using this decoding method, multiple processing of CIRC codes can be performed, but additional hardware (interleaver block) is needed.

Another method used in decoding CIRC utilising multiple processing of CIRC is disclosed in U.S. Pat No. 4,637,021. Error detection and error correction is achieved by processing blocks of digital data bytes with a C1 decoder and a C2 decoder. In order to maximise the rate at which data is processed, decoders C1 and C2 actually operate concurrently on data stored in a system memory with the C1 decoder operating on the data ahead of the C2 decoder. According to the disclosed decoding method of the CIRC correction code, error processing up to double-error correction is executed in C1 decoding in first stage, and double-error correction is executed in C2 decoding at next stage by referring to C1 pointer information that is derived from the C1 decoder. In this case, C1 pointer information is not used to increase the error correction capability of error correction systems. C1 pointer information is used to check the quality of the decoding process.

In the method according to the U.S. Pat No. 4,852,099, data bytes are read by means of C1 and C2 decoders from the system memory according to the following sequence. A first C1 decoder processes a C1 block of data bytes (32 bytes). A first C2 decoder then processes a C2 block of data bytes (28 bytes) that has already been processed by the C1 decoder; this concludes a first pass. A second C1 decoder processes data bytes that have already been processed by the first pass, and a second C2 decoder processes data bytes that have already been processed by the first pass and the second C1 decoder; this concludes a second pass. A decoder cycle comprises the execution of both, the first pass and the second pass. At the end of each decoder cycle, an address counter is incremented, and the decoder cycle is repeated. New data is immediately written into memory locations when the data (C1 block) in the input buffer is ready. Thus, during operation the reading of the four decoders continually advances through the memory until available data has been processed.

The method according to U.S. Pat No. 4,852,099 for use in decoding CIRC is implemented by utilising a deinterleaver implementation and a special method of controlling data. A deinterleaver block is provided in a system memory (256×32 bytes) and consists of two blocks, a C1 memory block (128×32 bytes) and a C2 memory block (128×32 bytes). The C1 memory block includes addresses in rows 112 to 239. C2 memory block includes addresses in rows 240 to 255 and then in rows 0 to 111. The system memory is circular. The lowest numbered system memory address "follows" the highest numbered one. This is depicted in FIG. 1.

According to the known method, the first C1 decoder processes the C1 memory block of 32 data bytes. The C1 decoder is initially positioned to read the C1 memory block at address 112. In each succeeding decoder cycle (execution of two passes by both, C1 and C2 decoders), the C1 decoder is positioned to read the C1 memory block at the next successively higher address. Thus, for the second cycle the C1 memory block is positioned at position 113.

The first C2 decoder processes a C2 memory block of 28 data bytes. The C2 decoder is initially positioned to read the C2 memory block at address 0 of the system memory. Those bytes building the C2 memory block are arranged along a diagonal of the system memory (see FIG. 1). Those bytes building the C2 memory block are changed into successive decoding cycles.

At the beginning of the second C1 pass, the C1 decoder is positioned to read the C1 memory block at address 240 of the system memory. At the beginning of the second C2 pass, the C2 decoder is initially positioned to read the C2 memory block at address 113 of the system memory. The execution of four decoding passes (one decoder cycle) continually advances through the system memory. If unprocessed data is still in the system memory, the decoding cycles are continued. If all data in the system memory is corrected, the operation of the error correction system is completed.

SUMMARY OF THE INVENTION

The method for decoding CIRC correction codes as described above has the following disadvantages:

a) Data in the system memory is processed during 256 cycles (four decoding passes in each decoder cycle). If all data in the system memory is corrected, the operation of error correction system is completed. When sufficient data is available in the input buffer, an interruption in the system memory processing occurs in order to allow the C1 memory block to be written into the system memory. Interruptions can occur several times during the system memory processing (256 cycles). Therefore, any data in the the system memory can't be processed twice (first C1, C2 passes and second C1, C2 passes).

b) Two decoders (C1 decoder and C2 decoder) need to be used concurrently on data stored in the system memory. Therefore, additional hardware is necessary.

c) The erasure correction method for Reed-Solomon codes cannot be used in conjunction with the method described above.

It is an object of the invention to disclose a method and an apparatus for use in decoding cross-interleaved Reed-Solomon code (CIRC) that efficiently corrects errors in a stream of data while hardware expenses are reduced.

It is another object of the invention to provide a method and an apparatus for use in decoding cross-interleaved Reed-Solomon code (CIRC) that corrects errors in a stream of data by utilising the so-called erasure correction method.

According to one aspect of the invention an error correction method is provided for use in a process of decoding cross-interleaved Reed-Solomon codes (CIRC) that corrects errors in data stored as C1-code words $C1\_CDW_k$ (k=0, . . . , 108) and C2-code words $C2\_CDW_m$ (m=0, . . . , 108) in a memory block with several locations Nij (i=0, . . . , 217; j=0, . . . , 31), each of said locations $N_{ij}$ containing a data byte of said data, the method comprising the following steps:

a1) reading and decoding said C1-code words $C1\_CDW_k$ from said locations $N_{ij}$ utilising decoder means on the basis of $$C1\_CDW_k^j = N_{ij},$$

for k=0, . . . , 108 and j=0, . . . , 31, where i=k+109 and where $C1\_CDW_k^j$ is a data byte at position j in said C1-code word $C1\_CDW_k$;

a2) correcting said C1-code words $C1\_CDW_k$ at least partially;

b1) reading and decoding said C2-code words $C2\_CDW_m$ from said locations $N_{ij}$ utilising said decoder means on the basis of $$C2\_CDW_m^j = N_{ij},$$

for m=0, . . . , 108 and j=0, . . . , 28, where i=m+4*j and where $C2\_CDW_m^j$ is a data byte at position j in said C2-code word $C2\_CDW_m$; and b2) correcting said C2-code words $C2\_CDW_m$ at least partially.

This method provides reading and decoding of C1 and C2 code words in a novel manner. This means that the new method implies specific regulations for defining which data words are to be used for C1 and C2 decoding and for the processing order. The system memory for a deinterleaver implementation can be of a smaller size as compared to conventional system memories. In addition, only a single CIRC decoder needs to be used for performing the method according to the invention.

The correction of a large burst error in C1 code words can be executed very efficiently for a low input error rate.

According to another aspect of the invention a novel apparatus for running the above-provided error correction method is also provided.

BRIEF DESCRIPTION OF THE DRAWING

Exemplary embodiments of the invention are illustrated in the drawings and are explained in more detail in the following description.

DESCRIPTION OF THE PREFFERED EMBODIMENTS

1. System Components

Figure 1:
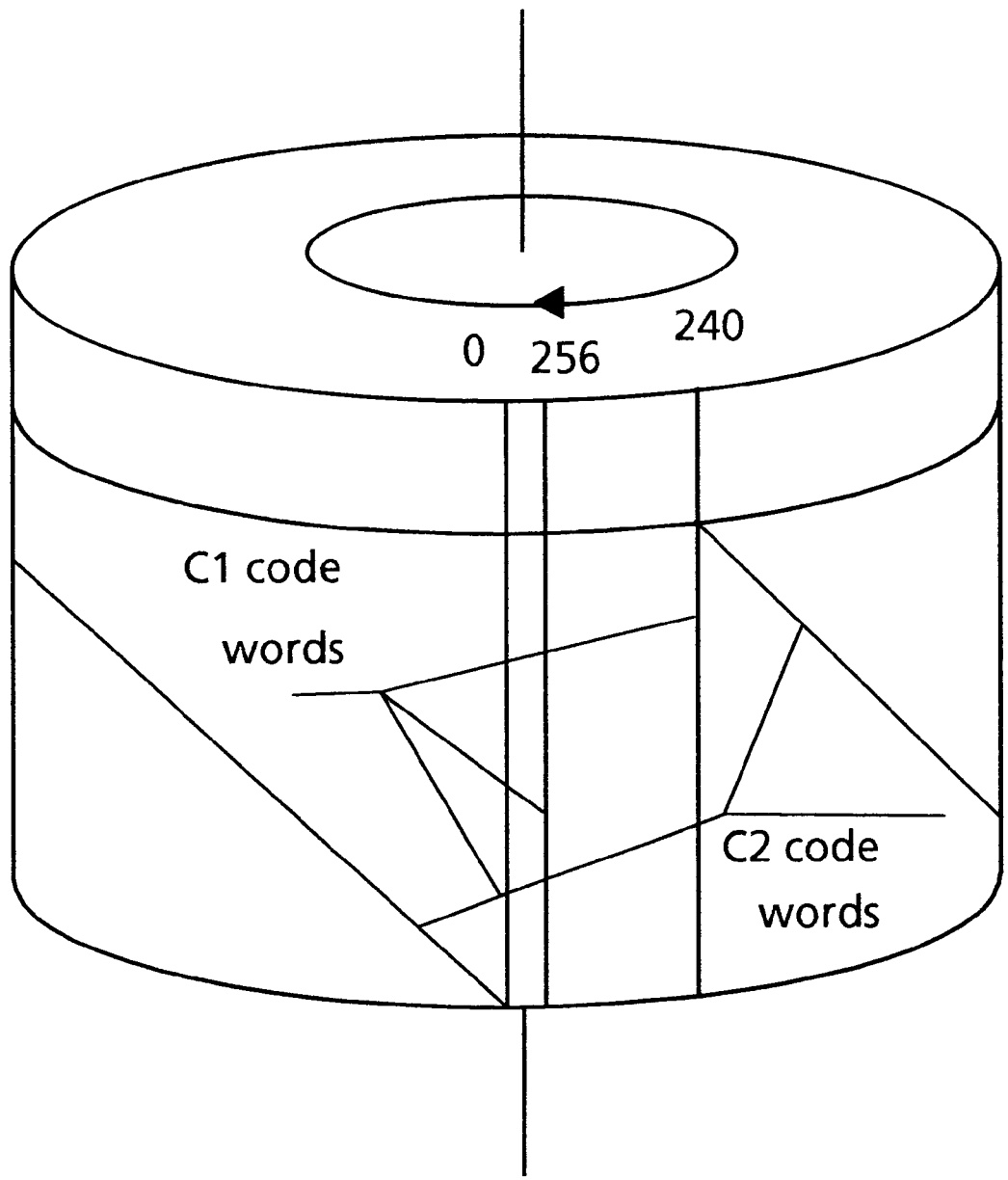
FIG. 1 shows an example of a system memory used in conjunction with a conventional error correction method.
Figure 2:
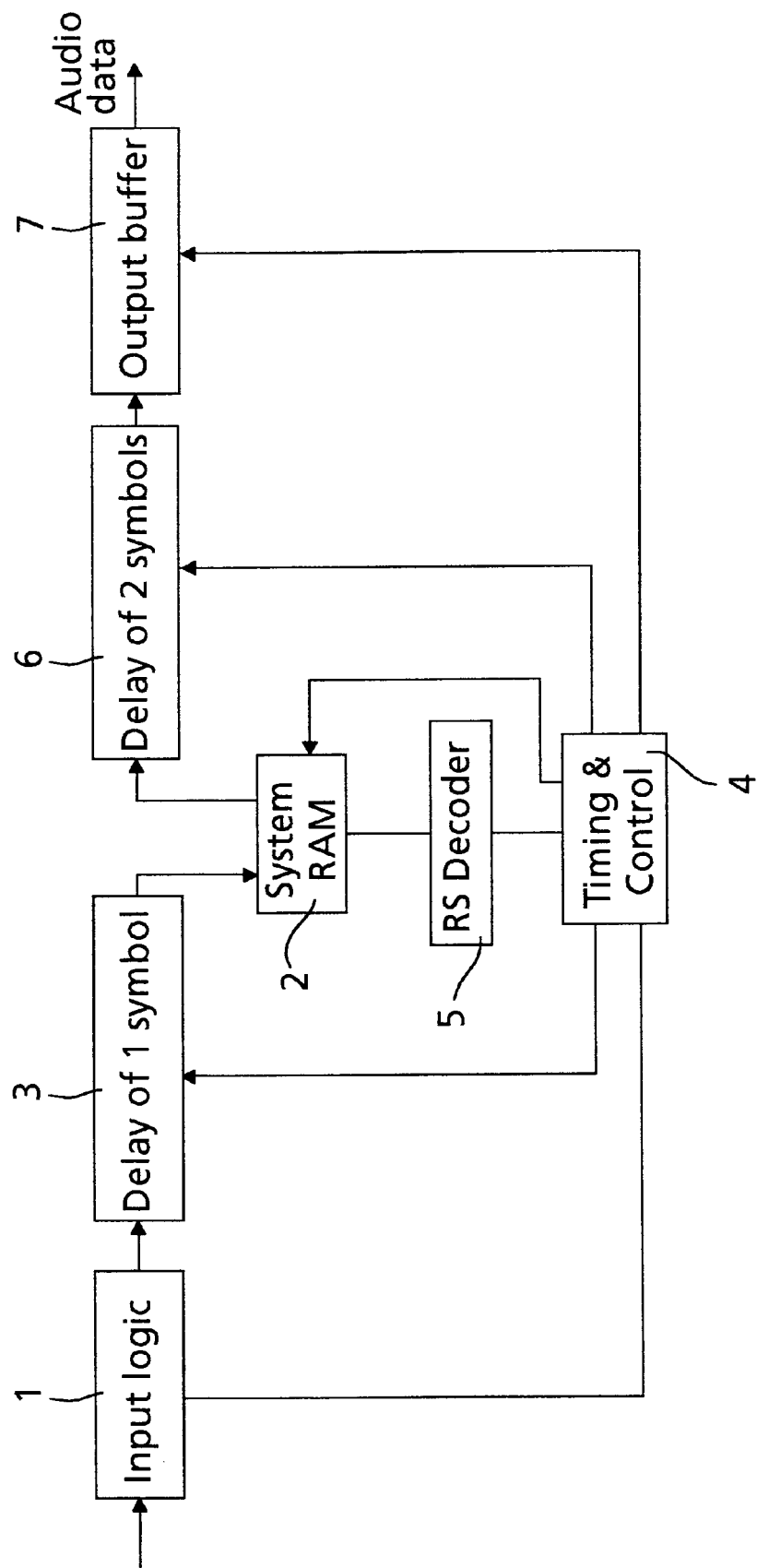
FIG. 2 shows a block diagram of a CIRC decoder suitable for performing the method according to the invention.

FIG. 2 is a block diagram of a CIRC decoder according to the invention.

A data stream from an acquisition part is stored in an input logic 1. Input logic 1 is able to store 109 C1 code words (32 bytes) in an input buffer. When sufficient data is available in the input buffer a data block (109×32) is written into a system memory 2, which preferably is a RAM. In system memory 2 two memory blocks B1, B2 are formed for storing data bytes.

A "delay of 1 symbol" element 3 is used for data delay as known from conventional CIRC decoders.

Means for addressing and determining memory locations in system memory 2 at which read, write, or error correction operations are to be run, are comprised in a timing and control element 4.

Figure 3:
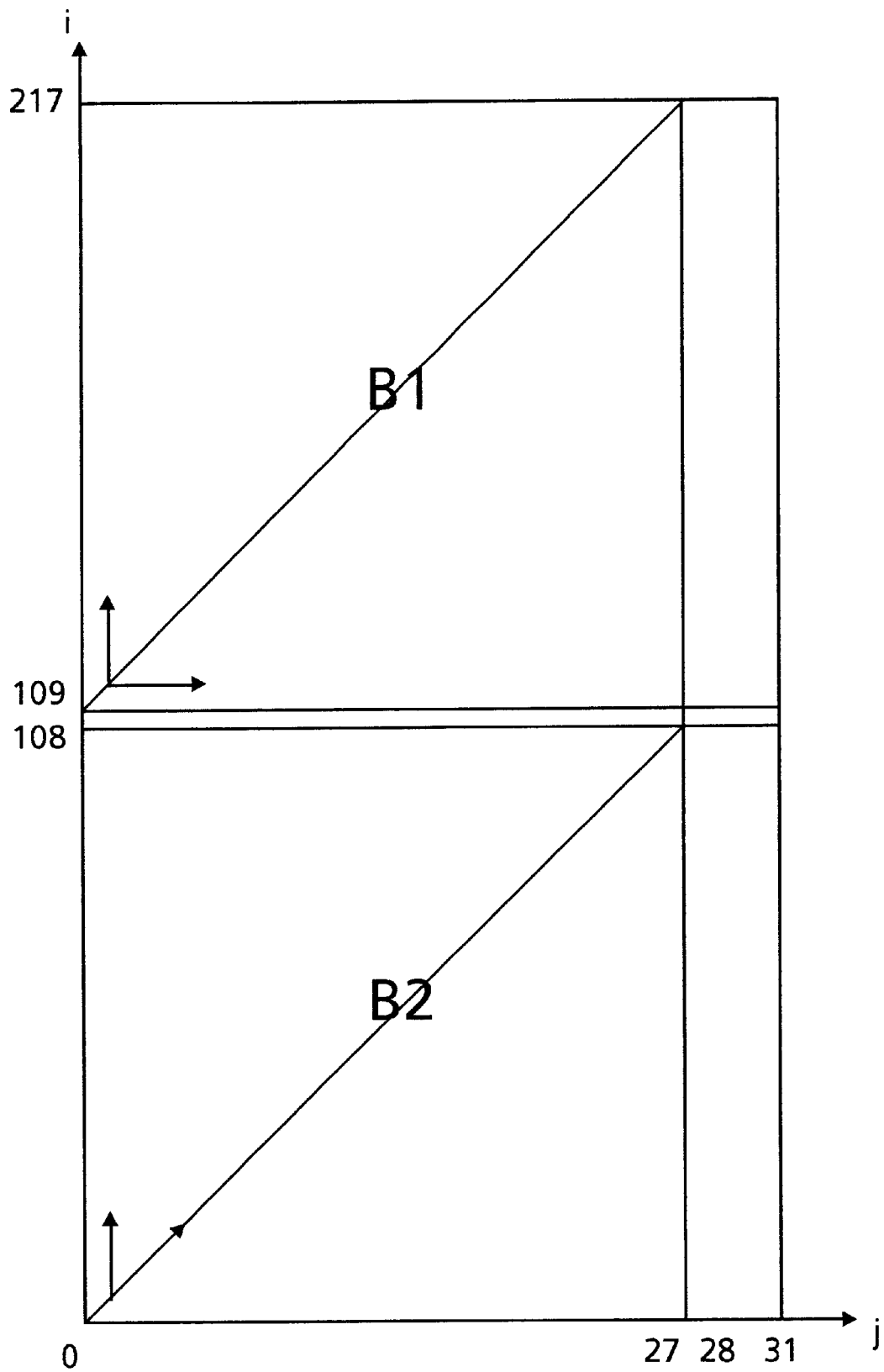
FIG. 3 shows a schematic representation of a memory block with memory blocks B1 and B2 in accordance with the invention.

For a better understanding, data bytes in system memory 2 are considered to be elements of a two dimensional Cartesian coordinate system as depicted in FIG. 3. This assumption is independent of a real hardware implementation of system memory 2.

Each vertical or i-axis position contains 32 bytes of C1 code words (see Fig.3). Each horizontal or j-axis represents an 8 bit byte at each j-axis position. Bytes are numbered sequentially within each j-position moving from left to right. That is in accordance with systematic of Reed-Solomon (RS) code. Parity bytes are in positions 28 to 31.

According to FIG. 2, a conventional RS decoder 5 is connected to system memory 2 and timing and control element 4. In the conventional RS decoder 5 so-called erasure correction method of RS code is implemented. RS decoder 5 is able to correct 4 erasures or 2 errors or any combinations of errors and erasures in accordance with: 2*t+E<d, where t is the number of errors in a code word, E is the number of erasures, and d is the Hamming distance of RS code. For a compact audio disc applications d is 4.

Addressing and determining of locations in the system memory 2 and the controlling of transferred data bytes during read, write and correction operations are performed utilising a timing and control element 5.

A delay of 2 symbols is performed in a "delay of 2 symbol" element 6. A C2 code word is corrected after a second decoder cycle of CIRC decoder is written into an output buffer 7.

2. Detailed Operations of Error-correction Method According to the Invention Referring to FIG. 4, operations of the new decoding method for multiple processing of a CIRC correction code are described in detail. When sufficient data is available in input logic 1 a data block (109×32 bytes) is written to i-positions 109, 110, . . . , 217 of the system memory 2 (see FIG. 3), steps 410 and 420.

Figure 4:
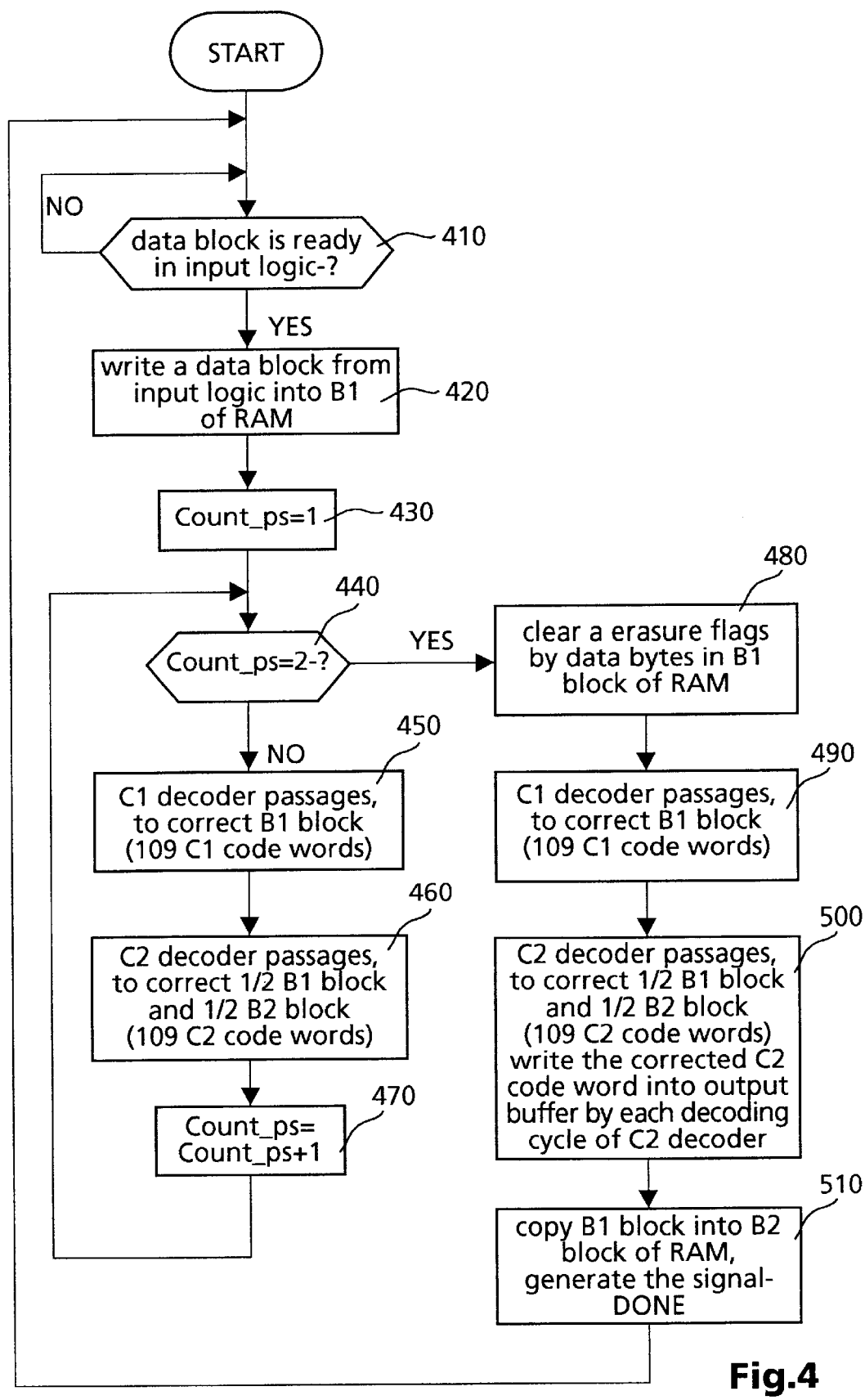
FIG. 4 shows a flow chart of the method according to the invention.

A counter pass of a B1 memory lock initially is initialised with 1 (430 in FIG. 4). Then a condition-Count_ps=2-? is analysed, step 440. If the result is NO then a step 450 is performed. In step 450 a RS decoder 5 which, at this time is in C1 level, is positioned for reading C1 code word (32 bytes, along j-positions for j=0, 1, . . . , 31) at i-position 109. In each succeeding C1 decoder cycle the RS decoder 5 is positioned forward and reads C1 code word at the successively next higher valued i-position. Thus, during the second C1 decoder cycle the RS decoder 5 is positioned at i-position 110. In the same manner the addressing is continued until i-position 217 is read for all j-positions (j=0, 1, . . . , 31).

In each C1 decoder cycle the RS decoder 5 tries to correct up to two errors. If three or more errors occur, which of course are not corrected, erasure flags are assigned to all uncorrected data bytes of C1 code word. Erasure flags are stored in an additional memory block (not shown) of system memory 2.

In general, the RS decoder 5 (at C1 level) performs continuously 109 decoding and correcting cycles (450 in FIG. 4). Then the B1 memory block (see FIG. 3) has been fully processed, i.e. the first pass of C1 decoding is completed. Thereafter, the RS decoder 5 which, at this time is in C2 level, is positioned for reading a C2 code word (28 bytes) at the i-position 0 (460 in FIG. 4). C2 code words are read along diagonals of B1 and B2 memory blocks. Addressing of C2 code words (C2-CDW) in read operations is in accordance with the following algorithm:

for(cycle=0; cycle<=108; ++cycle)

{for($j$=0; $j$<28; ++$j$)

{$i$=cycle+4*$j$;  (1)

C2_CDW[$j$]=memory[$i$] [$j$];

}

} where memory [i] [j] is a location in system memory 2.

In each C2 decoder cycle the RS decoder 5 is trying to correct up to 4 erasures or 2 errors or any combinations of errors and erasures on the basis of the following condition: 2*t+E<d, where t is the number of errors in a code word, E is the number of erasures, d is the Hamming distance of RS code.

Erasure information (C1 pointer information) assigned during C1 decoding cycles is used by C2 decoding and correction operations. In step 460 uncorrectable C2 code words are not marked, i.e. erasure flags are not assigned.

In total the RS decoder 5 (at C2 level) continuously performs 109 C2 decoding and correcting cycles (step 460 in Fig.4). After those operations 109 C2 code words are processed and the first pass of C2 decoding is completed. After 109 C2 decoding and correcting cycles the content of the counter Count_ps (counter of passes; 470 in FIG. 4) is increased and becomes 2.

During step 440 again the condition Count_ps=2–? is analysed. If the result is YES a step 480 has to be performed and the erasure flags of all data bytes in the B1 memory block are cleared. Then, the RS decoder 5 (at C1 level) again is positioned for reading C1 code words at i-position 109 during step 490. In each succeeding C1 decoder cycle the RS decoder 5 is positioned forward, and the C1 code word at the next successively higher i-position is read. Thus, during the second C1 decoder cycle the RS decoder 5 is positioned at i-position 110. In the same manner the addressing is continued until i-position 217. During each C1 decoder ycle the RS decoder 5 is trying to correct up to two errors. If three or more errors occur, which of course are not corrected, erasure flags are assigned to all uncorrected bytes of the C1 code word.

In general, the RS decoder 5 (at C1 level) continuously performs again 109 decoding and correcting cycles (step 490 in FIG. 4). Then B1 memory block has been fully processed, i.e. the second pass of C1 decoding is completed. Following, the RS decoder 5 (at C2 level) is again positioned to read the C2 code word (28 bytes) at i-position 0. C2 code words are read along diagonals of B2 and B1 memory blocks, step 500. Addressing of C2 code words in reading operations is performed according to the above-mentioned algorithm (1).

The RS decoder 5 again is trying to correct up to 4 erasures or 2 errors or any combinations of errors and erasures by each C2 decoder cycle. If the RS decoder 5 is not able to correct the current C2 code word data bytes are flagged. Thereafter, the processed C2 code words are written into output buffer 7 (see FIG. 2).

The RS decoder (at C2 level) continuously performs 109 C2 decoding and correcting cycles. After 109 C2 code words have been processed, a second pass of C2 decoding is completed. Then, the B1 memory block with erasure information is moved into the B2 memory block of system memory 2 (see step 510 in FIG. 4). A signal DONE is generated in the timing and control element 4. This signal gives the information that all data bytes in the system memory 2 have been processed exactly twice. Then step 410 is executed again.

3. Burst Error Correction

In the following the burst error correction utilising the method according to the invention is explained.

A) Correction of a C1 Code Word Burst With High Input Error Rate (C1 Code Words are Fully or Almost Fully Destroyed)

Figure 5:
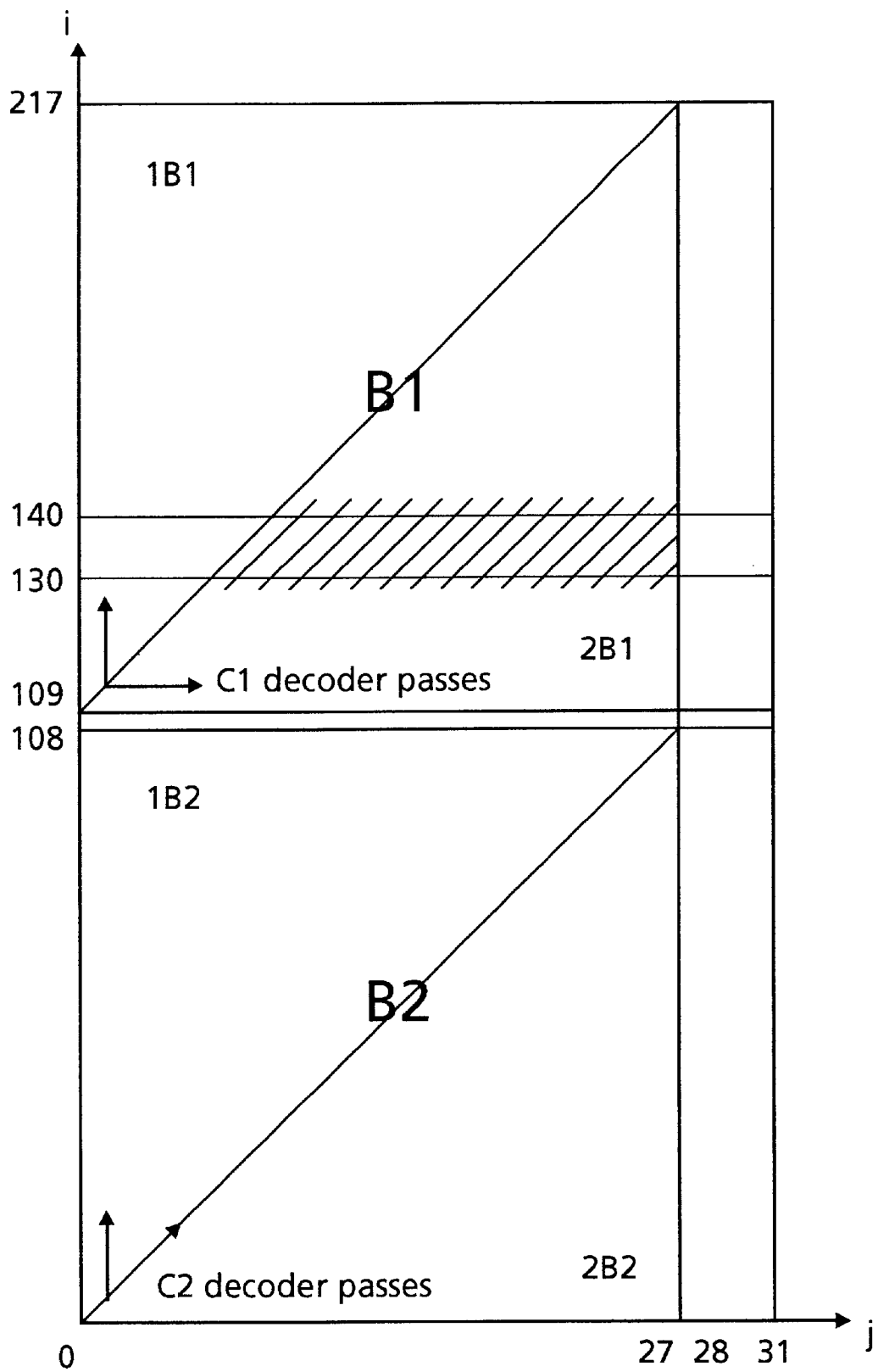
FIG. 5 shows the memory block of FIG. 3 with memory sectors.

Detailed operations of the correction method of the CIRC correction code in accordance with the invention are described in connection with the burst error. It is assumed that the B2 memory block has already been corrected (in a previous stage) and in the B2 memory block there are no errors. The B1 memory block is loaded from (by) input logic 1. At i-positions 130, . . . , 140 there is a burst error (11 corrupted C1 code words, see FIG. 5).

RS decoder 5 (at C1 level) starts and tries to decode and correct successively 109 C1 code words in the B1 memory block. Code words at i-positions 130, . . . , 140 are uncorrectable and therefore are flagged (for each byte in each C1 code word the erasure flag is assigned).

Then, the RS decoder 5 (at C2 level) starts and tries to decode and correct successively 109 C2 code words in B1 and B2 memory blocks. During that operation the RS decoder 5 (at C2 level) has to read bytes from memory sectors 2B1 and 1B2 (see FIG. 5). After completion of the first pass of the RS decoder 5 (109 C1 passes and 109 C2 passes) flagged bytes at i-positions (130–140) within memory sector 2B1 are corrected, while flagged bytes at i-positions (130–140) within memory sector 1B1 remain uncorrected.

In a second pass the RS decoder 5 (at C1 level) tries to decode and correct successively 109 C1 code words in the B1 memory block. Code words at positions 130, . . . , 140 are again flagged, but in fact, at this time errors are only present in memory sector 1B1. Then, the RS decoder 5 (at C2 level) starts and tries to decode and correct successively 109 C2 code words in B1 and B2 memory blocks.

Figure 6:
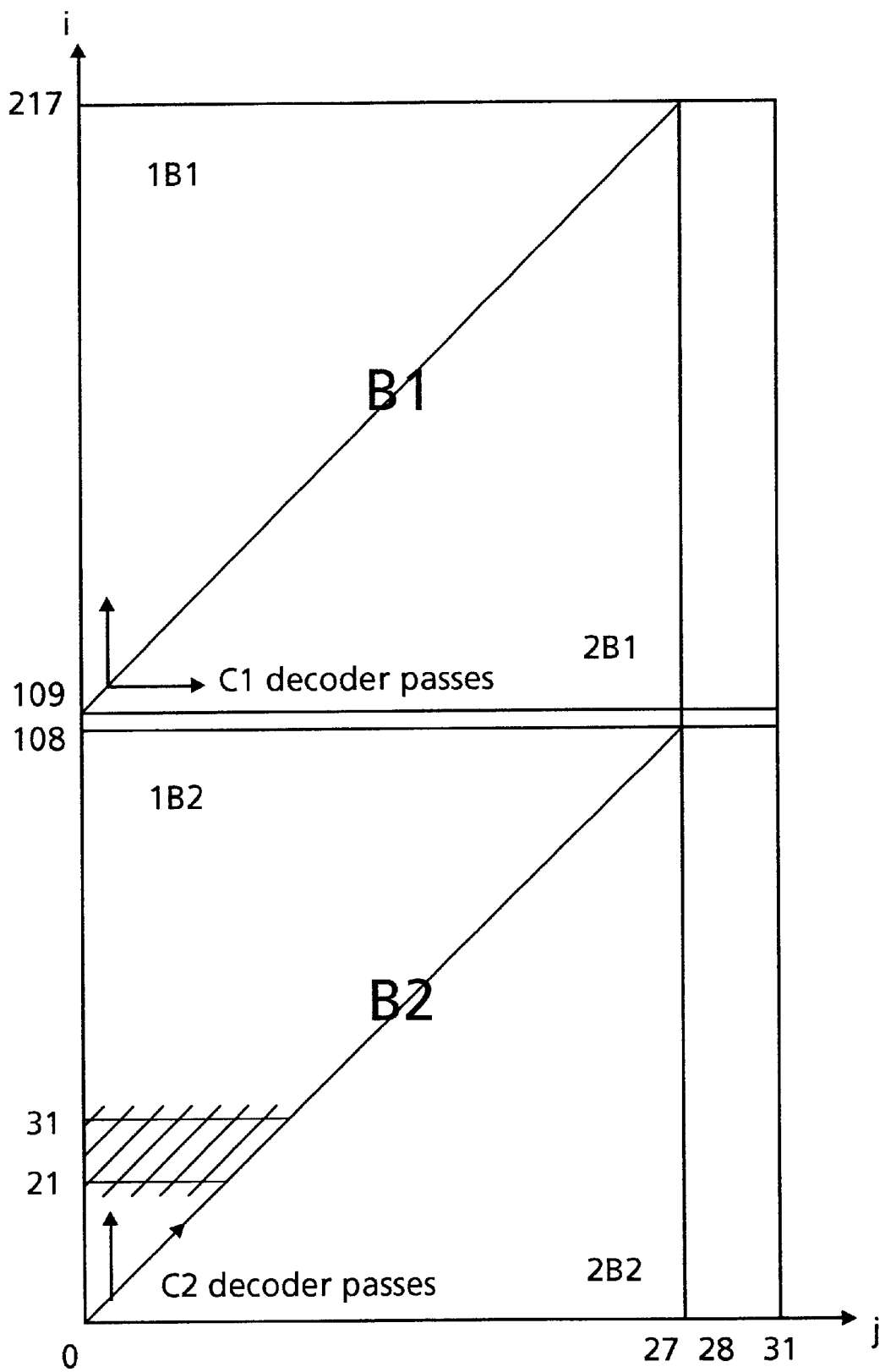
FIG. 6 shows the memory block of FIG. 5 with memory block B1 moved into memory block B2.

In a next stage the corrected B1 memory block with erasure information is coped into the B2 memory block of the system memory (see FIG. 6). Thereafter, a new data block is loaded from input logic 1 into the B1 memory block and the CIRC decoder starts again. Now remaining errors are (exist) in the memory sector 1B2 (bytes with erasure information). The RS decoder 5 (at C1 level) starts and tries to decode and correct successively 109 C1 code words in the B1 memory block.

Then, the RS decoder 5 (at C2 level) starts and tries to decode and correct successively 109 C2 code words in B1 and B2 memory blocks. During this stage errors in memory sector 1B2 (remaining errors at i-positions 21, . . . , 31) are corrected.

The CIRC decoder implementing the method according to the invention is able to correct 14 corrupted C1 code words (limit) with a high input error rate.

B) Correction of a C1 Code Word Burst With Low Input Error Rate (Each C1 Code Word With 3 to 6 Errors)

The CIRC decoder implementing the method according to the invention is working very efficiently if corrupted C1 code words have a low input error rate. This will be explained in the following.

In C2 code word error-correction (first pass of CIRC decoder) the RS decoder 5 (at C2 level) is able to correct any random combination of erasures (up to 4 erasures), i.e. during second pass CIRC decoder the RS decoder 5 (at C1 level) is able to correct any C1 code words which have not been corrected during the first pass of the CIRC decoder (at C1 level). Therefore, during the second pass of the CIRC decoder it is possible to correct any C2 code words which have not been corrected during the first pass of the CIRC decoder (at C2 level).

Figure 7:
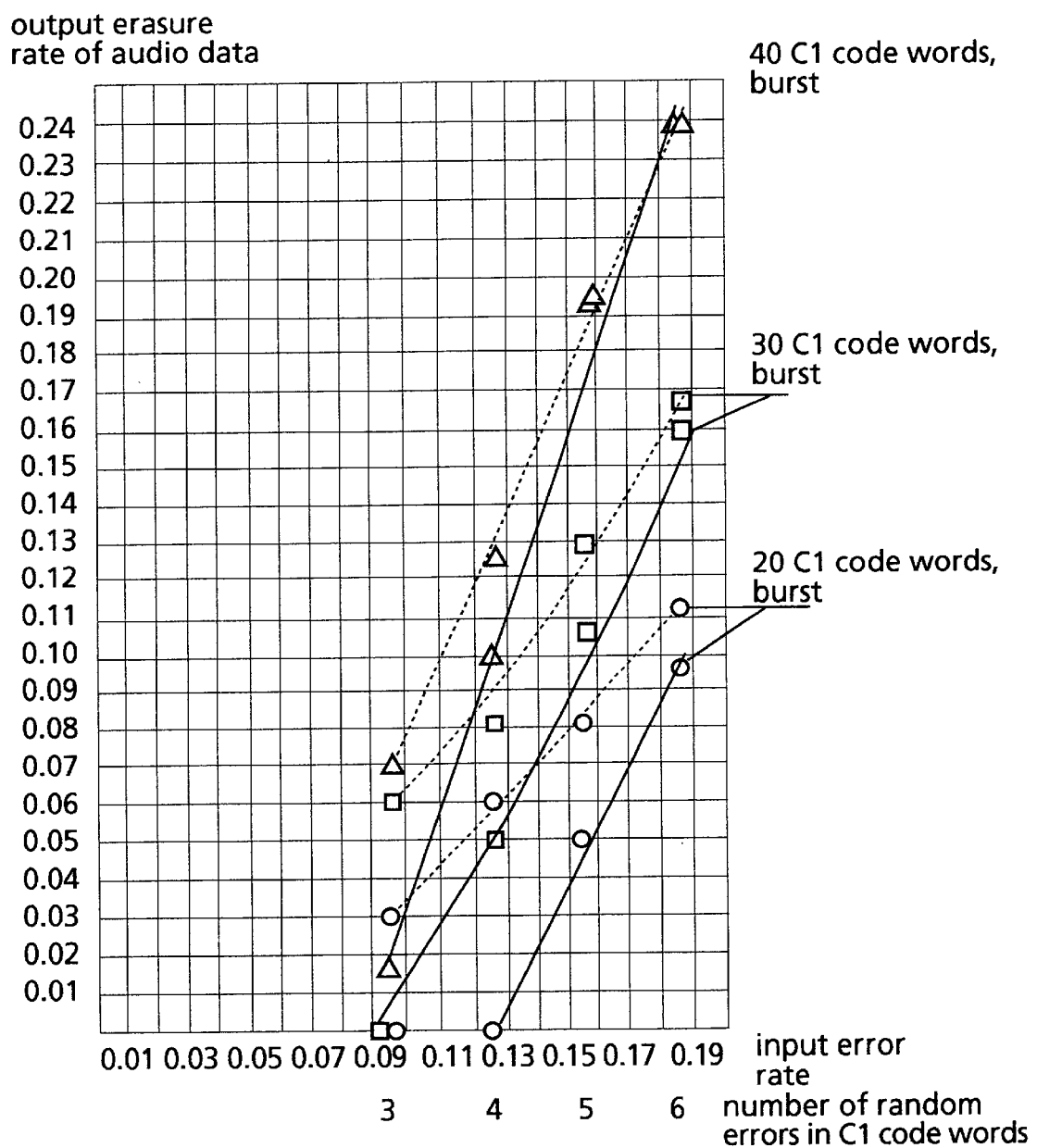
FIG. 7 shows a diagram that compares results of a conventional error correction method and the error correction method according to the invention, respectively.

This can be shown by referring to FIG. 7. In FIG. 7 results of the error-correction for (of) two CIRC decoders are depicted—a conventional CIRC decoder and a CIRC decoder implementing the method according to the invention, respectively. Results of a conventional CIRC decoder are depicted by means of solid lines. Results of a CIRC decoder implementing the method according to the invention are depicted by means of dashed lines.

Results are shown for the following combinations of errors:

1. Bust error of 20 C1 code words with 3 errors in each C1 code word (random errors).
2. Burst error of 20 C1 code words with 4 errors in each C1 code word.
3. Burst error of 20 C1 code words with 5 errors in each C1 code word.
4. Burst error of 20 C1 code words with 6 errors in each C1 code word.

5. Burst error of 30 C1 code words with 3 errors in each C1 code word.
6. Burst error of 30 C1 code words with 4 errors in each C1 code word.
7. Burst error of 30 C1 code words with 5 errors in each C1 code word.
8. Burst error of 30 C1 code words with 6 errors in each C1 code word.
9. Burst error of 40 C1 code words with 3 errors in each C1 code word.
10. Burst error of 40 C1 code words with 4 errors in each C1 code word.
11. Burst error of 40 C1 code words with 5 errors in each C1 code word.
12. Burst error of 40 C1 code words with 6 errors in each C1 code word.

Results of burst-error correction of 20 C1 code words with different numbers of errors in each C1 code word are depicted in FIG. 7 (circles). The CIRC decoder implementing the method according to the invention is able to correct a burst error of 20 C1 code words with 3 and 4 errors in each code word. If 5 and 6 errors occur in C1 code words the CIRC decoder implementing the method according to the invention is not able to correct a burst error of 20 C1 code words. However, the output erasure rate of audio data CIRC decoder implementing the method according to the invention is significantly lower.

For the CIRC decoder implementing the method according to the invention a better performance in error-correction is obtained for the correction of bust errors of 30 C1 code words compared to a conventional CIRC decoder. The CIRC decoder implementing the method according to the invention is able to correct a burst error of 30 C1 code words with 3 errors in each code word. The output erasure rate of audio data in the CIRC decoder implementing the method according to the invention is also lower (results are depicted by means of square points). Advantages of the CIRC decoder implementing the method according to the invention decrease with further growing input error rate.

Limitation for both, the conventional CIRC decoder and the CIRC decoder implementing the method according to the invention are burst error 14 C1 (completely corrupted) code words. In this case the error correction performance for a conventional CIRC decoder and for a CIRC decoder implementing the method according to the invention does not differ.

What is claimed is:

1. Error-correction method for use in a process of decoding cross-interleaved Reed-Solomon code (CIRC) that corrects errors in data stored as C1-code words $C1\_CDW_k$ (k=0, ..., 108) and C2-code words $C2\_CDW_m$ (m=0, ..., 108) in a memory with several locations $N_{ij}$ (i=0, ..., 217; j=0, ..., 31), each of said locations $N_{ij}$ containing a data byte of said data, the method comprising the following steps:
   a1) reading and decoding (450) said C1-code words $C1\_CDW_k$ from said locations $N_{ij}$ utilising decoder means (5) on the basis of $$C1\_CDW_k^j = N_{ij},$$

for k=0, ..., 108 and j=0, ..., 31, where i=k+109 and where $C1\_CDW_k^j$ is a data byte at position j in said C1-code word $C1\_CDW_k$;
   a2) correcting said C1-code words $C1\_CDW_k$ at least partially;
   b1) reading and decoding (460) said C2-code words $C2\_CDW_m$ from said locations $N_{ij}$ utilising said decoder means (5) on the basis of $$C2\_CDW_m^j = N_{ij},$$

for m=0, ..., 108 and j=0, ..., 28, where i=m+4*j and where $C2\_CDW_m^j$ is a data byte at position j in said C2-code word $C2\_CDW_m$; and
   b2) correcting said C2-code words $C2\_CDW_m$ at least partially.

2. The method according to claim 1, wherein correcting of said C1-code words $C1\_CDW_k$ and said C2-code words $C2\_CDW_m$ is performed by means of an erasure correction method of Reed-Solomon code.

3. The method according to claim 2, including the step of providing first erasure information by assigning first erasure flags to data bytes of said C1-code words $C1\_CDW_k$ which are erroneous and not corrected during step a2).

4. The method according to claim 3, including the step of using said first erasure information for error correction in said step b2).

5. The method according to claim 1, including the step of repeating steps a1) and a2).

6. The method according to claim 5, including the step of providing second erasure information by assigning second erasure flags to data bytes of said C1-code words $C1\_CDW_k$ which are erroneous and not corrected in said repeating of step a2).

7. The method according to claim 5, including the step of repeating steps b1) and b2).

8. The method according to claim 7, including the step of using said second erasure information for error correction in said step of repeating step b2).

9. The method according to claim 7, including the step of providing third erasure information by assigning third erasure flags to data bytes of said C2-code words $C2\_CDW_m$ which are erroneous and not corrected in said repeating of step b2).

10. The method according to claim 2, wherein the steps of correcting said read C1-code words $C1\_CDW_k$ and correcting said read C2-code words $C2\_CDW_m$, respectively, are performed on the basis of $$2*t+E<d$$

where t is the number of errors, E is the number of erasures and d is Hamming distance.

11. The method according to claim 10 wherein d is 5.

12. The method according to claim 1, wherein said several locations $N_{ij}$ form a memory block B1 with B1-locations $N^1_{ij}$ (i=0, ..., 108; j=0, ..., 31) and a memory block B2 with B2-locations $N^2_{ij}$ (i=109, ..., 217; j=0, ..., 28), each of said B1-locations $N^1_{ij}$ and B2-locations $N^2_{ij}$ containing one of said data bytes, the method including the step of moving data bytes contained in said memory block B1 into said memory block B2.

13. Apparatus for detection and correction of errors in a process of decoding crossinterleaved Reed-Solomon code (CIRC) that corrects errors in a stream of data, the apparatus comprising:
   memory means for storing said stream of data as C1-code words $C1\_CDW_k$ (k=0, ..., 108) and C2-code words $C2\_CDW_m$ (m=0, ..., 108) on several memory locations $N_{ij}$ (i=0, ..., 217; j=0, ..., 31), each of said memory locations $N_{ij}$ containing a data byte of said stream of data;
   means for reading said C1-code words $C1\_CDW_k$ on the basis of $$C1\_CDW_k^j = N_{ij},$$

for k=0, ..., 108 and j=0, ..., 31, where i=k+109 and where $C1\_CDW_k^j$ is a data byte at position j in said C1-code words $C1\_CDW_k$;

means for decoding said read C1-code word $C1\_CDW_k$;

means for correcting said decoded C1-code words;

decoder means for reading said C2-code words $C2\_CDW_m$ on the basis of $$C2\_CDW_m^j = N_{ij},$$

for m=0, ..., 108 and j=0, ..., 28, where i=m+4*j and where $C2\_CDW_m^j$ is a data byte at position j in said C2-code word $C2\_CDW_m$;

means for decoding said read C2-code words $C2\_CDW_m$; and means for correcting said decoded C2-code words.

14. Apparatus according to claim 13, wherein said means for decoding said read C1-code words $C1\_CDW_k$ and said means for decoding said read C2-code words $C2\_CDW_m$ are provided in a decoder suitable for decoding cross-interleaved Reed-Solomon code (CIRC).

15. Apparatus according to claim 13, characterised in that, that in said memory means a memory block B1 with B1-locations $N^1_{ij}$ (i=0, ..., 108; j=0, ..., 31) and a memory block B2 with B2-locations $N^2_{ij}$ (i=109, ..., 217; j=0, ..., 28) are formed, each of said B1-locations $N^1_{ij}$ and B2-locations $N^2_{ij}$ containing one data byte of said stream of data.

* * * * *